US00RE41643E

(19) United States
(12) Reissued Patent
Garbuzov et al.

(10) Patent Number: US RE41,643 E
(45) Date of Reissued Patent: Sep. 7, 2010

(54) HIGH POWER SEMICONDUCTOR LASER DIODE

(75) Inventors: Dmitri Zalmanovich Garbuzov, Princeton, NJ (US); Joseph Hy Abeles, East Brunswick, NJ (US); John Charles Connolly, Clarksburg, NJ (US)

(73) Assignee: Trumpf Photonics, Inc., Cranbury, NJ (US)

(21) Appl. No.: 10/778,019

(22) Filed: Feb. 13, 2004

Related U.S. Patent Documents

Reissue of:
(64) Patent No.: 5,818,860
Issued: Oct. 6, 1998
Appl. No.: 08/757,883
Filed: Nov. 27, 1996

(51) Int. Cl.
*H01S 5/00* (2006.01)

(52) U.S. Cl. ..... 372/45.01; 372/43.01
(58) Field of Classification Search ..... 372/43.01, 372/45.01
See application file for complete search history.

(56) References Cited

U.S. PATENT DOCUMENTS 5,661,742 A 8/1997 Huang et al.

FOREIGN PATENT DOCUMENTS

| | | |
|---|---|---|
| JP | 04-234188 | 8/1992 |
| JP | 07-045909 | 2/1995 |
| JP | 07-335979 | 12/1995 |
| JP | 08-064906 | 3/1996 |
| JP | 08-195529 | 7/1996 |

OTHER PUBLICATIONS

Garbuzov et al. (High power seperate confinement heterostructure AlGaAs/GaAs laser diodes with broadened waveguide) SPIE vol. 2682, pp. 20–26.*

Ablyazov et al. "Possibility of increasing the maximum radiation intensity in heterolasers with a wide waveguide, " Sov. J. Quantum Electron, vol. 20, No. 1, pp. 1320–1323 (1990).

Cockerill et al. "Depressed index cladding graded barrier seperate confinement single quantum well heterostructure laser, " Appl. Phys. Lett., vol. 59, No. 21, pp. 2694–2607 (1991).

Emanuel et al., "High–Efficiency AlGaAs–Based Laser Diode at 808 nm with Large Transverse Spot size, " IEEE Photonics Technology Letters, vol. 8, No. 10, pp. 1291–1293, (1996).

Garbuzov et al., "High–Power 0.8 μm InGaAsP–GaAs SCH SQW Lasers, " IEEE Journal of Quantum Electronics, vol. 27, No. 6, pp. 1531–1536 (1991).

Garbuzov et al., "High Power seperate confinement heterostructure AlGaAs/GaAs laser diodes with broadened waveguide, " SPIE, vol. 2692, pp. 20–28, (1996).

(Continued)

*Primary Examiner*—Dung T Nguyen
(74) *Attorney, Agent, or Firm*—Fish & Richardson P.C.

(57) ABSTRACT

A semiconductor laser diode having increased efficiency and therefore increased power output. The laser diode includes a body of a semiconductor material having therein a waveguide region which is not intentionally doped so as to have a doping level of no greater than about $5\times10^{16}/cm^3$. Within the waveguide region is means, such as at least one quantum well region, for generating an optical mode of photons. Clad regions of opposite conductivity type are on opposite sides of the waveguide region. The thickness of the waveguide region, a thickness of at least 500 nanometers, and the composition of the waveguide and the clad regions are such so as to provide confinement of the optical mode in the waveguide region to the extent that the optical mode generating does not overlap into the clad regions from the waveguide region more than about 5%.

104 Claims, 1 Drawing Sheet

OTHER PUBLICATIONS

Mawst et al., "8 W continuous wave front–facet power from broad–waveguide Al–free 980 nm diode lasers, " Appl. Phys. Lett., vol. 69, No. 11, pp. 1532–1534 (1996).

Petrescu–Prahova, "High Power low confinement AlGaAs/GaAs single quantrum well laser diode operating in the fundamental lateral mode, " Conference Proceedings, Conference on Lasers 7 Electro–Optics (CLEO) Tuesday Afternoon/ Europe, p. 171 (1994).

Waters, et al., "Dark–Line–Resistant Diode Laser at 0.8 μm Comprising InAlGaAs Strained Quantum Well, " IEEE Pnotonics Technology Letters, vol. 3, No. 5, pp. 409–411 (1991).

Office Action from corresponding Japanese Application No. PH09–363805, mailed Feb. 20, 2007, English translation included (15 total pages).

Ito, R. and Nakamura, M., *Foundation and Application of Semiconductor Laser*, Baifukan Co., Ltd., 1st Edition, 5th printing, pp. 50–53 and 82–84, Mar. 30, 1995 (Japan).

* cited by examiner

HIGH POWER SEMICONDUCTOR LASER DIODE

Matter enclosed in heavy brackets [ ] appears in the original patent but forms no part of this reissue specification; matter printed in italics indicates the additions made by reissue.

The present invention is directed to a semiconductor laser diode having increased output power, and, more particularly, to a high power semiconductor laser diode having an enlarged waveguide.

BACKGROUND OF THE INVENTION

A semiconductor laser diode basically comprises a body of a semiconductor material or materials having a waveguide region and a clad region on each side of the waveguide region. Within the waveguide region is a region, such as a quantum well region, in which photons are generated when the diode is properly biased by and electrical current. The clad regions are doped to be of opposite conductivity type and are of a material having a lower refractive index than the material of the waveguide region so as to attempt to confine the photons to the waveguide region.

In the design of laser diodes heretofore made and known to those skilled in the art as being of optimum design, the thickness of the waveguide region was limited in extent, usually to be in the order of 0.2 to 0.3 micrometers (μm), so as to achieve a minimization of the threshold current. To achieve the minimization of the threshold current, a substantial overlapping of the optical mode generated in the waveguide region into the adjacent doped regions, such as the dad regions, occurred. Although a major portion of the optical mode generated in the waveguide region remains and travels along the waveguide region, a portion of the optical mode at each end thereof extends into, i.e., overlaps into, the regions of the diode adjacent the waveguide region. This typically results in undesirable optical propagation losses. The propagation loss in a clad region contributes to the propagation loss of the lasing mode to the extent of the propagation loss of said clad region multiplied by the overlap factor of the clad region by the lasing mode. The overlap factor of a clad region is the proportion of photons which are carried in the clad region. Throughout this specification the term "propagation loss" means the propagation loss of the lasing mode. Thus, the overall efficiency of the device is reduced, thereby limiting directly and indirectly the output power capability of the device. Another constant on typical semiconductor laser diodes heretofore made has been the length of the diode, i.e., the distance between its ends. The longer the laser diode, the lower the thermal and electrical resistance of the diode and therefore, in general, the larger the output power. However, because of the lower efficiency resulting from the propagation losses, the length of the laser diode has been limited.

High efficiency, high power lasers have long been pursued for such applications as optical pumping of solid state and fiber laser, direct material processing, printing, communications, sensing, etc. Therefore, it would be desirable to improve the efficiency and reduce the losses of such laser diodes so as to increase the output power of the devices.

SUMMARY OF THE INVENTION

A semiconductor laser diode formed of a body of a semiconductor material. The body includes a waveguide region which is not intentionally doped and having therein means for generating photons. A separate clad region is on each side of the waveguide region and the clad regions are at least partially doped to be of opposite conductivity types. The thickness of the waveguide region and the composition of the waveguide and clad regions are such that an overlapping of the optical mode generating in the waveguide region into the clad regions is no greater than about 5%.

DETAILED DESCRIPTION

Figure 1:
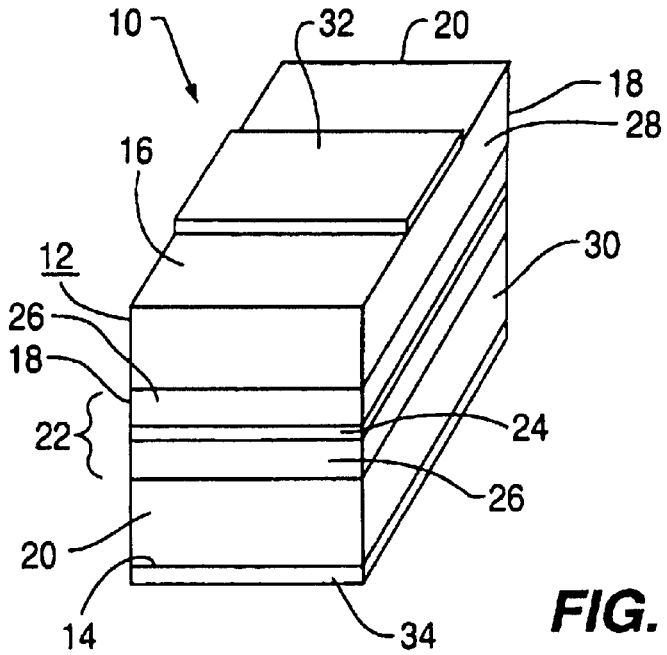
FIG. 1 is a perspective view of a basic semiconductor laser diode which incorporates the present invention.

Referring initially to FIG. 1, a semiconductor laser diode which incorporates the present invention is generally designated as 10. Laser diode 10 comprises a body 12 of a semiconductor material or materials having a bottom surface 14, top surface 16, end surfaces 18 and side surfaces 20. The body 12 includes a waveguide region 22 extending thereacross. Within the waveguide region 22 is an active region 24 in which photons are generated when an appropriate electrical bias is placed across the diode 10. The active region 24 may be of any structure well known in the laser diode art which is capable of generating photons. Preferably, the active region 24 comprises one or more quantum wells. The waveguide region 22 includes layers 26 on each side of the active region 24 which are of undoped semiconductor material having a doping level of no greater than about $5\times10^{16}$ atoms/cm$^3$.

On each side of the waveguide region 22 is a separate clad region 28 and 30. The clad regions 28 and 30 are layers of a semiconductor material of a composition which has a lower refractive index than the materials of the layers 26 of the waveguide region 22. Also, the clad regions 28 and 30 are at least partially doped to be of opposite conductivity type. The doping level in the clad regions 28 and 30 are typically between about $5\times10^{17}$/cm$^3$ and $2\times10^{19}$/cm$^3$. For example, the clad region 28 between the waveguide region 22 and the top surface 16 of the body 12 may be of P-type conductivity and the clad region 30 between the waveguide region 22 and the bottom surface 14 of the body 12 may be of N-type conductivity.

A contact layer 32 of a conductive material, such as a metal, is on and in ohmic contact with the P-type conductivity clad region 28. The contact layer 32 is in the form of a strip which extends between the end surfaces 18 of the body 12 and is narrower than the width of the body 12, i.e., the distance between the side surfaces 20 of the body 12. A contact layer 34 of a conductive material, such as a metal, is on and in ohmic contact with the N-type conductivity clad region 30. The contact layer 34 extends across the entire area of the bottom surface 14 of the body 12.

In the laser diode 10 to achieve the higher efficiency and thus the higher output power, the thickness of the waveguide region 22 and the composition of the waveguide region 22 and the clad regions 28 and 30 must be such that the optical mode generated by the active region 24 does not overlap from the waveguide region 22 into the clad regions 28 and 30 by more than 5%, and preferably by not more than 2%.

However, the amount of overlap of the photons into the clad regions 28 and 30 need not be less than 1%. This means that the amount of the optical mode, which is mainly in the waveguide region 22, that extends into (overlaps) the clad regions 28 and 30 is no greater than about 5% of the total optical mode. To achieve this, the thickness of the waveguide region should be at least 500 nanometers (nm) and the composition of the waveguide region 22 and the clad regions 28 and 30 should be such that the refractive index of the regions provides the confinement of the optical mode in the waveguide region 22 to the extent that the overlap of the optical mode into the clad regions 28 and 30 is not greater than 5%. The various regions of the body 12 may be made of any of the well known semiconductor materials used for making laser diode, such as but not limited to gallium arsenide, aluminum gallium arsenide, indium phosphide, indium gallium arsenide and such quaternary materials as indium, gallium arsenide phosphide. However, the materials used for the various regions must have refractive indices which provide the desired confinement of the optical mode. The clad regions 28 and 30 may be doped uniformly throughout their thickness or may be graded with little or no doping at their junction with the waveguide region 22 and the heaviest doping at the respective surface of the body 12.

Figure 2:
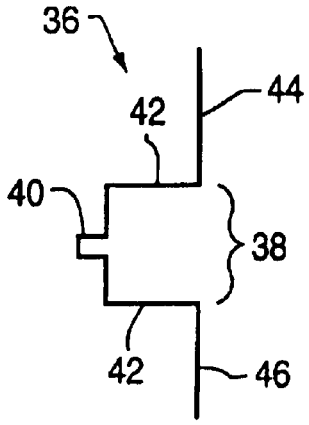
FIG. 2 is a representation of a separate confinement heterostructure (SCH) laser diode which can incorporate the present invention.

Referring to FIG. 2, there is schematically shown one form 36 of a laser diode in accordance with the present invention. Laser diode 36 is similar in structure to the laser diode 10 shown in FIG. 1 and includes a waveguide region 38 having therein a single quantum well region 40 of undoped $In_{20}Ga_{80}As$ and a separate confinement layer 42 of undoped $Al_{30}Ga_{70}As$ on each side of the quantum well region 40. A P-type conductivity clad region 44 is on one side of the waveguide region 38 and an N-type conductivity clad region 46 is on the other side of the waveguide region 38. Each of the clad regions 44 and 46 are of $Al_{60}Ga_{30}As$. Although the laser diode 36 is shown as having only a single quantum well region 40, it may have a plurality of quantum well regions which are spaced apart by barrier regions as is well known in the laser diode art.

Figure 3:
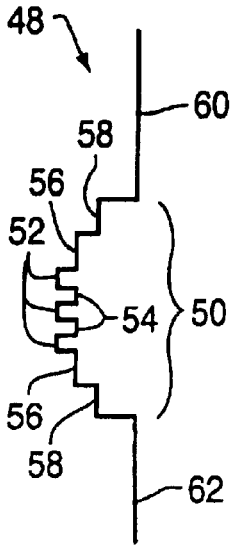
FIG. 3 is a representation of a stepped SCH laser diode which can incorporate the present invention.

Referring to FIG. 3, another form of the laser diode in accordance with the present invention is schematically shown and generally designated 48. Laser diode 48 comprises a waveguide region 50 having therein three quantum well regions 52 of InGaAsP and spaced apart by barrier regions 54 of InGaAsP having a bandgap of 1.0 eV. At each side of the quantum well regions 52 are inner confinement layers 56 also of InGaAsP having a bandgap of 1.0 eV. Adjacent each of the inner confinement layers 56 is an outer confinement layer 58 of InGaAsP having a bandgap of 1.13 eV. Adjacent the outer confinement layers 58 are clad regions 60 and 62 of InP which are doped N-type and P-type respectively. The clad regions 60 and 62 are doped to a level of between $5\times10^{17}/cm^3$ and $2\times10^{19}/cm^3$. The N-type clad region 60 is doped uniformly throughout its thickness, but the P-type clad region 62 may have a graded doping from a lowest level at the interface with the outer confinement layer 58 to a highest level at its surface.

Laser diodes 48 were made with the quantum well regions 52 being of a thickness of 4.5 nm, and the barrier regions being of a thickness of 16 nm. The inner confinement layers 56 were of a thickness of 30 nm. In one laser diode 48 the outer confinement layers were of a thickness of 300 nm. and in another laser diode 48 the outer confinement layers were of a thickness of 600 nm. This provided laser diodes 48 in which the total thickness of the waveguide regions 50 were 0.7 and 1.3 μm respectively. When tested the laser diodes were found to have an increasing efficiency with increased thickness. The laser diode 48 having the 1.3 μm thick waveguide region 50 had an efficiency 1.3 time higher and threshold currents 10–20% lower than the laser diode 48 having the 0.7 thick waveguide region 50. Output powers of 4.6 W, CW and 6.8 W, quasi-CW at wavelengths of 1.42 to 1.5 μm were obtained from these laser diodes 48.

Figure 4:
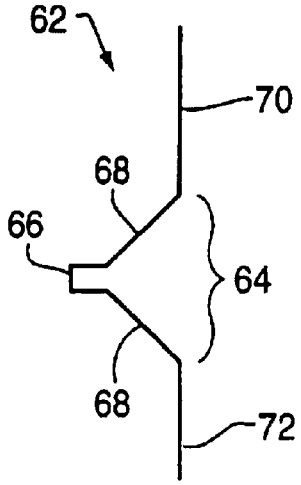
FIG. 4 is a representation of a GRIN-SCH form of laser diode which can incorporate the present invention.

Referring to FIG. 4, still another form of a laser diode incorporating the present invention is schematically shown and is generally designated as 62. Laser diode 62 has a waveguide region 64 in which is a quantum well region 66. On each side of the quantum well region 66 is a confinement region 68. Clad regions 70 and 72 of N-type and P-type conductivity are at opposite sides of the waveguide region 64. In the laser diode 62 the confinement regions 68 are of a material whose composition is graded to provided a graded band gap. Although the laser diode 62 is shown with a single quantum well region 66 it can have a multiple number of quantum well regions spaced by barrier regions, such as shown in the laser diode 48 shown in FIG. 3.

Thus there is provided by the present invention a laser diode having a thicker waveguide region, at least 500 nm in thickness, and which has a small overlap of the optical mode into the clad regions, no greater than bout 5%. Since the waveguide region is not intentionally doped, it has a small thermal and electrical resistance, so that the optical mode can travel through the waveguide region with little optical loss. Since only a small portion of the optical mode overlaps into the more highly doped clad regions, which have a greater thermal and electrical resistance, there is only a small optical loss in the clad regions. Since the optical losses are lower, the device has a greater efficiency and a greater optical power output. In addition, the laser diode of the present invention provides a larger area spot size of the emitted beam. The larger spot size reduces the damage to the emitting surface of the laser diode so as to increase the operating lifetime of the laser diode. In addition, the laser diode of the present invention can be made longer, i.e., lengths of 2 millimeters or longer. Since there is lower losses in the laser diode it can be made longer to provide greater power output. Furthermore, although the laser diode shown and described is of a separate confinement quantum well structure, it should be understood that the present invention can be used in laser diodes of any of the well known structure, such as lateral waveguiding ridge structures, buried structures, gain-guided structures, distributed feedback structures, distributed Bragg reflector structures, etc.

What is claimed is:

1. A semiconductor laser diode comprising:

a body of a semiconductor material having therein a waveguide region which is not intentionally doped and which is of a material which substantially confines photons therein and allows the flow of photons therealong;

means within the waveguide region for generating an optical mode of photons; and a clad region on each side of the waveguide region, the clad regions being at least partially doped to be of opposite conductivity type;

*wherein:* said photon generating means [being] *is* thinner than the thickness of the waveguide region and [being] *is* spaced from the clad [layers] *regions*;

the thickness of the waveguide region and the composition of the waveguide and clad regions [being] *are* such that an overlapping of the optical mode generated in the waveguide region into the clad regions is not greater than about 5%;

*the waveguide region is of a thickness of at least 500 nanometers; and*

*the waveguide region has a doping level of no greater than $5\times10^{16}/cm^3$.*

[2. The semiconductor laser diode of claim 1 in which the waveguide region is of a thickness of at least 500 nanometers.]

[3. The semiconductor laser diode of claim 2 in which the waveguide region has a doping level of no greater than $5\times10^{16}/cm^3$.]

4. The semiconductor laser diode of claim [3] *1* in which the materials of the waveguide region and the clad regions have a refractive index which provides confinement of the optical mode to the waveguide region with an overlap of the optical mode into the clad regions of no greater than 5%.

5. The semiconductor laser diode of claim 4 in which the means for generating photons in the waveguide region includes at least one quantum well region.

6. The semiconductor laser diode of claim 5 in which the means for generating photons in the waveguide region includes a plurality of spaced quantum well regions with a barrier region between each pair of adjacent quantum well regions.

7. The semiconductor laser diode of claim 5 in which the clad regions are of a semiconductor material having a lower index of refraction than the materials of the portions of the waveguide region adjacent the clad regions.

8. The semiconductor laser diode of claim 7 in which the portions of the waveguide region on each side of the quantum well region is of a semiconductor material having a bandgap larger than that of the quantum well region.

9. The semiconductor laser diode of claim 8 in which the portion of the waveguide region on each side of the quantum well region is of uniform composition throughout its thickness.

10. The semiconductor laser diode of claim 8 in which each of the portions of the waveguide region on each side of the quantum well region has an inner portion adjacent the quantum well region which has a bandgap greater than the quantum well region and an outer portion adjacent the clad region which has a bandgap greater than that of the inner portion.

11. The semiconductor laser diode of claim 8 in which the portion of the waveguide region on each side of the quantum well region has a graded composition.

12. A semiconductor laser diode comprising:

a body of a semiconductor material having top and bottom surfaces and opposed end surface;

a waveguide region in the body extending across the body between the end surfaces, said waveguide region being not intentionally doped and being of a material which substantially confines photons therein and allows the flow of photons therealong;

means in the waveguide region for generating an optical mode of photons;

a first clad region of one conductivity type between the waveguide region and the top surface of the body; and a second clad region of the opposite conductivity type between the waveguide region and the bottom surface of the body;

*wherein:* said photon generating means [being] *is* thinner than the thickness of the waveguide region and [being] *is* spaced from the clad region;

the thickness of the waveguide region and the composition of the waveguide and clad regions [being] *are* such that the generated optical mode does not overlap into the clad regions from the waveguide region more than about 5%;

*the waveguide region is of a thickness of at least 500 nanometers; and*

*the waveguide region has a doping level of not greater than about $5\times10^{16}/cm^3$.*

[13. The semiconductor laser diode of claim 12 in which the waveguide region is of a thickness of at least 500 nanometers.]

[14. The semiconductor laser diode of claim 13 in which the waveguide region has a doping level of not greater than about $5\times10^{16}/cm^3$.]

15. The semiconductor laser diode of claim [14] *12* in which the materials of the waveguide region and the clad regions have a refractive index which provides confinement of the optical mode to the waveguide region with an overlap of the optical mode into the clad regions of no greater than 5%.

16. The semiconductor laser diode of claim 15 in which the means for generating photons in the waveguide region includes at least one quantum well region.

17. The semiconductor laser diode of claim 16 in which the means for generating photons in the waveguide region includes a plurality of spaced quantum well regions.

18. The semiconductor laser diode of claim 16 in which the clad regions are of a semiconductor material having a lower index of refraction than the materials of the portions of the waveguide regions adjacent the clad regions.

19. The semiconductor laser diode of claim 18 in which the portions of the waveguide region on each side of the quantum well region is of a semiconductor material having a bandgap larger than that of the quantum well regions.

*20. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%; and*

*wherein the means for generating photons in the waveguide region includes a plurality of spaced quantum well regions with a barrier region between each pair of adjacent quantum well regions.*

*21. The semiconductor laser diode of claim 20, wherein the waveguide region is of a thickness of at least 500 nanometers.*

*22. The semiconductor laser diode of claim 20, wherein the waveguide region has a doping level of no greater than $5\times10^{16}/cm^3$.*

*23. The semiconductor laser diode of claim 20, wherein the materials of the waveguide region and the clad regions*

*have a refractive index which provides confinement of the optical mode to the waveguide region with an overlap of the optical mode into the clad regions of no greater than 5%.*

*24. The semiconductor laser diode of claim 56, wherein the means for generating photons in the waveguide region includes at least one quantum well region.*

*25. The semiconductor laser diode of claim 56, wherein the means for generating photons in the waveguide region includes a plurality of spaced quantum well regions with a barrier region between each pair of adjacent quantum well regions.*

*26. The semiconductor laser diode of claim 20, wherein the clad regions are of a semiconductor material having a lower index of refraction than materials of portions of the waveguide region adjacent the clad regions.*

*27. The semiconductor laser diode of claim 24, wherein portions of the waveguide region on each side of the quantum well region are of a semiconductor material having a bandgap larger than that of the quantum well region.*

*28. The semiconductor laser diode of claim 24, wherein portions of the waveguide region on each side of the quantum well region each have an inner portion adjacent the quantum well region with a bandgap greater than the quantum well region and an outer portion adjacent the clad region with a bandgap greater than that of the inner portion.*

*29. The semiconductor laser diode of claim 20, wherein the thickness of the waveguide region and the composition of the waveguide and clad regions are such that an overlapping of the optical mode generated in the waveguide region into the clad regions is not greater than about 2%.*

*30. The semiconductor laser diode of claim 20, wherein the waveguide region has a length greater than about 2.0 mm.*

*31. The semiconductor laser diode of claim 20, wherein the waveguide region is of a thickness of about 0.7 μm.*

*32. The semiconductor laser diode of claim 20, wherein the waveguide region is of a thickness of about 1.3 μm.*

*33. The semiconductor laser diode of claim 24, wherein the quantum well region consists essentially of InGaAs.*

*34. The semiconductor laser diode of claim 20, wherein the waveguide region consists essentially of AlGaAs.*

*35. The semiconductor laser diode of claim 24, wherein the quantum well region consists essentially of InGaAsP.*

*36. The semiconductor laser diode of claim 20, wherein the waveguide region consists essentially of InGaAsP.*

*37. The semiconductor laser diode of claim 20, wherein the waveguide region comprises In and Ga.*

*38. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%; and*

*wherein the quantum well region consists essentially of InGaAs.*

*39. The semiconductor laser diode of claim 38, wherein the waveguide region consists essentially of AlGaAs.*

*40. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein the quantum well region consists essentially of InGaAsP.*

*41. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein the waveguide region consists essentially of InGaAsP.*

*42. The semiconductor laser diode of claim 38, wherein the waveguide region is of a thickness of at least 500 nanometers.*

*43. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such*

*that an overlapping of the optical mode generated in the waveguide region into the clad regions is not greater than about 5%, and*

*wherein the waveguide region has a doping level of no greater than* $5\times10^{16}/cm^3$.

*44. The semiconductor laser diode of claim 38, wherein the materials of the waveguide region and the clad regions have a refractive index which provides confinement of the optical mode to the waveguide region with an overlap of the optical mode into the clad regions of no greater than 5%.*

*45. A semiconductor laser diode comprising:*

*a body of a semiconductor material having therein a waveguide region comprising In and Ga, which is not intentionally doped and which substantially confines photons therein and allows the flow of photons thereal-ong;*

*a plurality of spaced quantum well regions within the waveguide region for generating an optical mode of photons with a barrier region between each pair of adjacent quantum well regions; and*

*a clad region on each side of the waveguide region, the clad regions being at least partially doped to be of opposite conductivity type;*

*wherein each of said quantum well regions is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%.*

*46. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein the clad regions are of a semiconductor material having a lower index of refraction than the materials of portions of the waveguide region adjacent the clad regions.*

*47. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein portions of the waveguide region on each side of the quantum well region are of a semiconductor material having a bandgap larger than that of the quantum well region.*

*48. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein portions of the waveguide region on each side of the quantum well region each have an inner portion adjacent the quantum well region with a bandgap greater than the quantum well region and an outer portion adjacent the clad region with a bandgap greater than that of the inner portion.*

*49. The semiconductor laser diode of claim 38, wherein a portion of the waveguide region on each side of the quantum well region has a graded composition.*

*50. The semiconductor laser diode of claim 38, wherein a portion of the waveguide region on each side of the quantum well region has a uniform composition.*

*51. The semiconductor laser diode of claim 38, wherein the thickness of the waveguide region and the composition of the waveguide and clad regions are such that an overlapping of the optical mode generated in the waveguide region into the clad regions is not greater than about 2%.*

*52. A semiconductor laser diode comprising:*

*a body of a semiconductor material having therein a waveguide region comprising In and Ga, which is not intentionally doped and which substantially confines photons therein and allows the flow of photons thereal-ong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in*

*the waveguide region into the clad regions is not greater than about 5%, and*

*wherein the waveguide region has a length greater than about 2.0 mm.*

*53. The semiconductor laser diode of claim 38, wherein the waveguide region has a thickness of about 0.7 μm.*

*54. A semiconductor laser diode of comprising:*

*a body of a semiconductor material having therein a waveguide region comprising In and Ga, which is not intentionally doped and which substantially confines photons therein and allows the flow of photons therealong;*

*a quantum well region within the waveguide region for generating an optical mode of photons; and*

*a clad region on each side of the waveguide region, the clad regions being at least partially doped to be of opposite conductivity type;*

*wherein said quantum well region is thinner than the thickness of the waveguide region and is spaced from the clad regions;*

*wherein the thickness of the waveguide regions and the composition of the waveguide and clad regions are such that an overlapping of the optical mode generated in the waveguide region into the clad regions is not greater than about 5%, and*

*wherein the waveguide region has a thickness of about 1.3 μm.*

*55. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%; and*

*wherein the waveguide region has a doping level of no greater than $5\times10^{16}/cm^3$.*

*56. The semiconductor laser diode of claim 55, wherein the waveguide region is of a thickness of at least 500 nanometers.*

*57. The semiconductor laser diode of claim 55, wherein the materials of the waveguide region and the clad regions have a refractive index that provides confinement of the optical mode to the waveguide region with an overlap of the optical mode into the clad regions of no greater than 5%.*

*58. The semiconductor laser diode of claim 55, wherein the clad regions are of a semiconductor material having a lower index of refraction than materials of portions of the waveguide region adjacent the clad regions.*

*59. The semiconductor laser diode of claim 55, wherein the thickness of the waveguide region and the composition of the waveguide and clad regions are such that an overlapping of the optical mode generated in the waveguide region into the clad regions is not greater than about 2%.*

*60. The semiconductor laser diode of claim 55, wherein the waveguide region has a length greater than about 2.0 mm.*

*61. The semiconductor laser diode of claim 55, wherein the waveguide region is of a thickness of about 0.7 μm.*

*62. The semiconductor laser diode of claim 55, wherein the waveguide region is of a thickness of about 1.3 μm.*

*63. The semiconductor laser diode of claim 55, wherein the waveguide region consists essentially of AlGaAs.*

*64. The semiconductor laser diode of claim 55, wherein the waveguide region consists essentially of InGaAsP.*

*65. The semiconductor laser diode of claim 55, wherein the waveguide region comprises In and Ga.*

*66. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%, and*

*wherein the clad regions are of a semiconductor material having a lower index of refraction than materials of portions of the waveguide region adjacent the clad regions.*

*67. The semiconductor laser diode of claim 66, wherein the waveguide region is of a thickness of at least 500 nanometers.*

*68. The semiconductor laser diode of claim 66, wherein the materials of the waveguide region and the clad regions have a refractive index which provides confinement of the optical mode to the waveguide region with an overlap of the optical mode into the clad regions of no greater than 5%.*

*69. The semiconductor laser diode of claim 66, wherein the means for generating photons in the waveguide region includes at least one quantum well region.*

*70. The semiconductor laser diode of claim 66, wherein the means for generating photons in the waveguide region includes a plurality of spaced quantum well regions with a barrier region between each pair of adjacent quantum well regions.*

*71. The semiconductor laser diode of claim 66, wherein the thickness of the waveguide region and the composition of the waveguide and clad regions are such that an overlapping of the optical mode generated in the waveguide region into the clad regions is not greater than about 2%.*

*72. The semiconductor laser diode of claim 66, wherein the waveguide region has a length greater than about 2.0 mm.*

*73. The semiconductor laser diode of claim 66, wherein the waveguide region is of a thickness of about 0.7 μm.*

*74. The semiconductor laser diode of claim 66, wherein the waveguide region is of a thickness of about 1.3 μm.*

*75. The semiconductor laser diode of claim 66, wherein the waveguide region consists essentially of AlGaAs.*

*76. The semiconductor laser diode of claim 66, wherein the waveguide region consists essentially of InGaAsP.*

*77. The semiconductor laser diode of claim 66, wherein the waveguide region comprises In and Ga.*

*78. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%, and*

*wherein the waveguide region has a length greater than about 2.0 mm.*

*79. The semiconductor laser diode of claim 78, wherein the waveguide region is of a thickness of at least 500 nanometers.*

*80. The semiconductor laser diode of claim 78, wherein the materials of the waveguide region and the clad regions have a refractive index which provides confinement of the optical mode to the waveguide region with an overlap of the optical mode into the clad regions of no greater than 5%.*

*81. The semiconductor laser diode of claim 78, wherein the means for generating photons in the waveguide region includes at least one quantum well region.*

*82. The semiconductor laser diode of claim 78, wherein the thickness of the waveguide region and the composition of the waveguide and clad regions are such that an overlapping of the optical mode generated in the waveguide region into the clad regions is not greater than about 2%.*

*83. The semiconductor laser diode of claim 78, wherein the waveguide region is of a thickness of about 0.7 μm.*

*84. The semiconductor laser diode of claim 78, wherein the waveguide region is of a thickness of about 1.3 μm.*

*85. The semiconductor laser diode of claim 78, wherein the waveguide region consists essentially of AlGaAs.*

*86. The semiconductor laser diode of claim 78, wherein the waveguide region consists essentially of InGaAsP.*

*87. The semiconductor laser diode of claim 78, wherein the waveguide region comprises In and Ga.*

*88. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%, and*

*wherein the waveguide region is of a thickness of about 1.3 μm.*

*89. The semiconductor laser diode of claim 88, wherein the waveguide region is of a thickness of at least 500 nanometers.*

*90. The semiconductor laser diode of claim 88, wherein the materials of the waveguide region and the clad regions have a refractive index which provides confinement of the optical mode to the waveguide region with an overlap of the optical mode into the clad regions of no greater than 5%.*

*91. The semiconductor laser diode of claim 88, wherein the means for generating photons in the waveguide region includes at least one quantum well region.*

*92. The semiconductor laser diode of claim 88, wherein the thickness of the waveguide region and the composition of the waveguide and clad regions are such that an overlapping of the optical mode generated in the waveguide region into the clad regions is not greater than about 2%.*

*93. The semiconductor laser diode of claim 88, wherein the waveguide region consists essentially of AlGaAs.*

*94. The semiconductor laser diode of claim 88, wherein the waveguide region consists essentially of InGaAsP.*

*95. The semiconductor laser diode of claim 89, wherein the waveguide region comprises In and Ga.*

*96. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%, and*

*wherein the waveguide region consists essentially of InGaAsP.*

*97. The semiconductor laser diode of claim 96, wherein the waveguide region is of a thickness of at least 500 nanometers.*

*98. The semiconductor laser diode of claim 96, wherein the materials of the waveguide region and the clad regions have a refractive index which provides confinement of the optical mode to the waveguide region with an overlap of the optical mode into the clad regions of no greater than 5%.*

*99. The semiconductor laser diode of claim 96, wherein the means for generating photons in the waveguide region includes at least one quantum well region.*

*100. The semiconductor laser diode of claim 96, wherein the thickness of the waveguide region and the composition of the waveguide and clad regions are such that an overlapping of the optical mode generated in the waveguide region into the clad regions is not greater than about 2%.*

*101. The semiconductor laser diode of claim 96, wherein the waveguide region is of a thickness of about 0.7 μm.*

*102. The semiconductor laser diode of claim 96, wherein the quantum well region consists essentially of InGaAsP.*

*103. A semiconductor laser diode comprising:*

*a body of a semiconductor material having therein a waveguide region which is not intentionally doped and which is of a material which substantially confines photons therein and allows the flow of photons therealong;*

*means within the waveguide region for generating an optical mode of photons; and*

*a clad region on each side of the waveguide region, the clad regions being at least partially doped to be of opposite conductivity type,*

*wherein said photon generating means is thinner than the thickness of the waveguide region and is spaced from the clad regions,*

*wherein at least a portion of the waveguide region on each side of the means for generating an optical mode of photons is of a uniform composition throughout its thickness,*

*wherein the thickness of the waveguide regions and the composition of the waveguide and clad regions are such that an overlapping of the optical mode generated in the waveguide region into the clad regions is not greater than about 5%, and*

*wherein the waveguide region comprises In and Ga.*

*104. The semiconductor laser diode of claim 103, wherein the waveguide region is of a thickness of at least 500 nanometers.*

*105. The semiconductor laser diode of claim 103, wherein the materials of the waveguide region and the clad regions have a refractive index which provides confinement of the optical mode to the waveguide region with an overlap of the optical mode into the clad regions of no greater than 5%.*

*106. The semiconductor laser diode of claim 103, wherein the means for generating photons in the waveguide region includes at least one quantum well region.*

*107. The semiconductor laser diode of claim 103, wherein the thickness of the waveguide region and the composition of the waveguide and clad regions are such that an overlapping of the optical mode generated in the waveguide region into the clad regions is not greater than about 2%.*

*108. The semiconductor laser diode of claim 103, wherein the waveguide region is of a thickness of about 0.7 μm.*

* * * * *

UNITED STATES PATENT AND TRADEMARK OFFICE

CERTIFICATE OF CORRECTION

PATENT NO. : RE41,643 E
APPLICATION NO. : 10/778019
DATED : September 7, 2010
INVENTOR(S) : Dmitri Zalmanovich Garbuzov et al.

It is certified that error appears in the above-identified patent and that said Letters Patent is hereby corrected as shown below:

On the Title page, column 1, first line of OTHER PUBLICATIONS, delete “seperate” and insert --separate--.

On the Title page, column 2, line 6, delete “seperate” and insert --separate--.

On the Title page, column 2, line 16, delete “seperate” and insert --separate--.

On column 11, line 7, in claim 54, after “diode” delete “of”.

On column 14, line 39, in claim 95, delete “claim 89” and insert --claim 88--.

On column 14, line 45, in claim 96, delete “therealong:” and insert --therealong;--.

Signed and Sealed this
Twenty-first Day of June, 2011

David J. Kappos

David J. Kappos
*Director of the United States Patent and Trademark Office*